(12) United States Patent  (10) Patent No.: US 8,861,245 B2
Watanabe  (45) Date of Patent: Oct. 14, 2014

(54) CONTROL CIRCUIT BOARD, CONTROL SYSTEM, AND COPYING METHOD

(71) Applicant: Kenichi Watanabe, Kanagawa (JP)

(72) Inventor: Kenichi Watanabe, Kanagawa (JP)

(73) Assignee: Ricoh Company, Limited, Tokyo (JP)

( * ) Notice: Subject to any disclaimer, the term of this patent is extended or adjusted under 35 U.S.C. 154(b) by 28 days.

(21) Appl. No.: 13/804,948

(22) Filed: Mar. 14, 2013

(65) Prior Publication Data

US 2013/0250644 A1  Sep. 26, 2013

(30) Foreign Application Priority Data

Mar. 22, 2012 (JP) .................................. 2012-066406
Jul. 6, 2012 (JP) .................................. 2012-152975

(51) Int. Cl.
*G11C 5/06* (2006.01)
*G06F 13/00* (2006.01)

(52) U.S. Cl.
CPC . *G11C 5/06* (2013.01); *G06F 13/00* (2013.01)
USPC .............................................. 365/63; 714/43

(58) Field of Classification Search
CPC .................................. G11C 5/06; G06F 13/00
USPC .............................................. 365/63; 714/43
See application file for complete search history.

(56) References Cited

U.S. PATENT DOCUMENTS

2006/0106982 A1* 5/2006 Ashmore et al. ............... 711/114
2008/0082866 A1* 4/2008 Li ..................................... 714/43
2012/0297107 A1* 11/2012 Mathew et al. ................ 710/313

FOREIGN PATENT DOCUMENTS

JP  2003-323298  11/2003
JP  2005-216263  8/2005

* cited by examiner

*Primary Examiner* — Anthan Tran
(74) *Attorney, Agent, or Firm* — Harness, Dickey & Pierce, P.L.C.

(57) ABSTRACT

A control circuit board includes a first storage unit configured to store therein predetermined data; a connecting unit configured to be connected to another control circuit board including a second storage unit; a switching unit configured to switch between a first state and a second state, the first state being a state in which data read from the first storage unit is enabled but data read from the second storage unit is disabled, the second state being a state in which data read from the first storage unit is disabled but data read from the second storage unit is enabled; and a storage control unit configured to write or read data to or from the first storage unit in the first state, and perform a copying operation that reads the data from the second storage unit and stores the read data in the first storage unit in the second state.

8 Claims, 11 Drawing Sheets

CONTROL CIRCUIT BOARD, CONTROL SYSTEM, AND COPYING METHOD

CROSS-REFERENCE TO RELATED APPLICATIONS

The present application claims priority to and incorporates by reference the entire contents of Japanese Patent Application No. 2012-066406 filed in Japan on Mar. 22, 2012 and Japanese Patent Application No. 2012-152975 filed in Japan on Jul. 6, 2012.

BACKGROUND OF THE INVENTION

1. Field of the Invention

The present invention relates to a control circuit board, a control system, and a copying method.

2. Description of the Related Art

Conventionally, image forming apparatuses such as copiers and multifunction peripherals (MFPs) store user-defined setting information and the like in a nonvolatile memory contained on a control circuit board (hereinafter, "board"). In an event of failure of the board on which this nonvolatile memory is contained, there arises the need of adjusting settings of a new board to the user-defined setting information.

There are known techniques related to this need. For example, Japanese Patent Application Laid-open No. 2003-323298 discloses a technique for backing up data stored in a nonvolatile memory of a failed board by: fabricating a maintenance board, which is a board containing a nonvolatile memory for use in extracting data from the memory; copying the data stored in the nonvolatile memory of the failed board to the nonvolatile memory of the maintenance board; and writing the data to a nonvolatile memory contained on a new replacement board.

However, such a conventional backup technique requires fabricating a maintenance board. In addition, it is required to distribute the maintenance boards to service personnel around the world because board failure can occur everywhere in the world. The conventional technique is disadvantageous in involving not only a considerably large amount of operations for maintenance management but also an increase in maintenance cost.

Therefore, there is a need for a control circuit board, a control system, and a copying method capable of facilitating maintenance management and reducing maintenance cost by eliminating the need of fabricating such maintenance boards.

SUMMARY OF THE INVENTION

It is an object of the present invention to at least partially solve the problems in the conventional technology.

According to an embodiment, there is provided a control circuit board that includes a first storage unit configured to store therein predetermined data; a connecting unit configured to be connected to another control circuit board that includes a second storage unit; a switching unit configured to switch between a first state and a second state, the first state being a state in which data read from the first storage unit is enabled but data read from the second storage unit is disabled, the second state being a state in which data read from the first storage unit is disabled but data read from the second storage unit is enabled; and a storage control unit configured to write or read data to or from the first storage unit in the first state, and perform a copying operation that reads the data from the second storage unit and stores the read data in the first storage unit in the second state.

According to another embodiment, there is provided a control system that includes a first control circuit board; and a second control circuit board including a second storage unit. The first control circuit board includes a first storage unit configured to store therein predetermined data; a connecting unit configured to be connected to the second control circuit board; a switching unit configured to switch between a first state and a second state, the first state being a state in which data read from the first storage unit is enabled but data read from the second storage unit is disabled, the second state being a state in which data read from the first storage unit is disabled but data read from the second storage unit is enabled; and a storage control unit configured to write or read data to or from the first storage unit in the first state, and perform a copying operation that reads the data from the second storage unit and stores the read data in the first storage unit in the second state.

According to still another embodiment, there is provided a copying method performed in a control circuit board that includes a first storage unit configured to store therein predetermined data and a connecting unit configured to be connected to another control circuit board that includes a second storage unit. The copying method includes switching between a first state and a second state, the first state being a state in which data read from the first storage unit is enabled but data read from the second storage unit is disabled, the second state being a state in which data read from the first storage unit is disabled but data read from the second storage unit is enabled; writing or reading data to or from the first storage unit in the first state; and performing a copying operation that reads the data from the second storage unit and stores the read data in the first storage unit in the second state.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention are described in detail below with reference to the accompanying drawings.

First Embodiment

A control circuit board (hereinafter, "board") according to a first embodiment is a facsimile control board incorporated in a facsimile or an MFP having a facsimile function. However, the board is not limited to such a facsimile control board.

Figure 1:
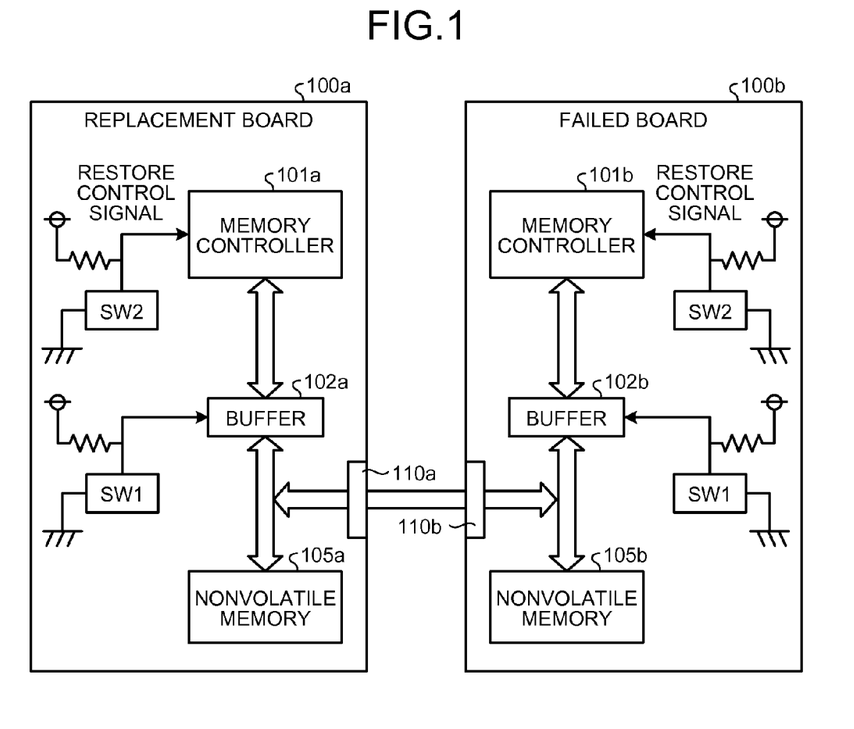
FIG. 1 is a schematic configuration diagram of a control system according to a first embodiment.
Figure 2:
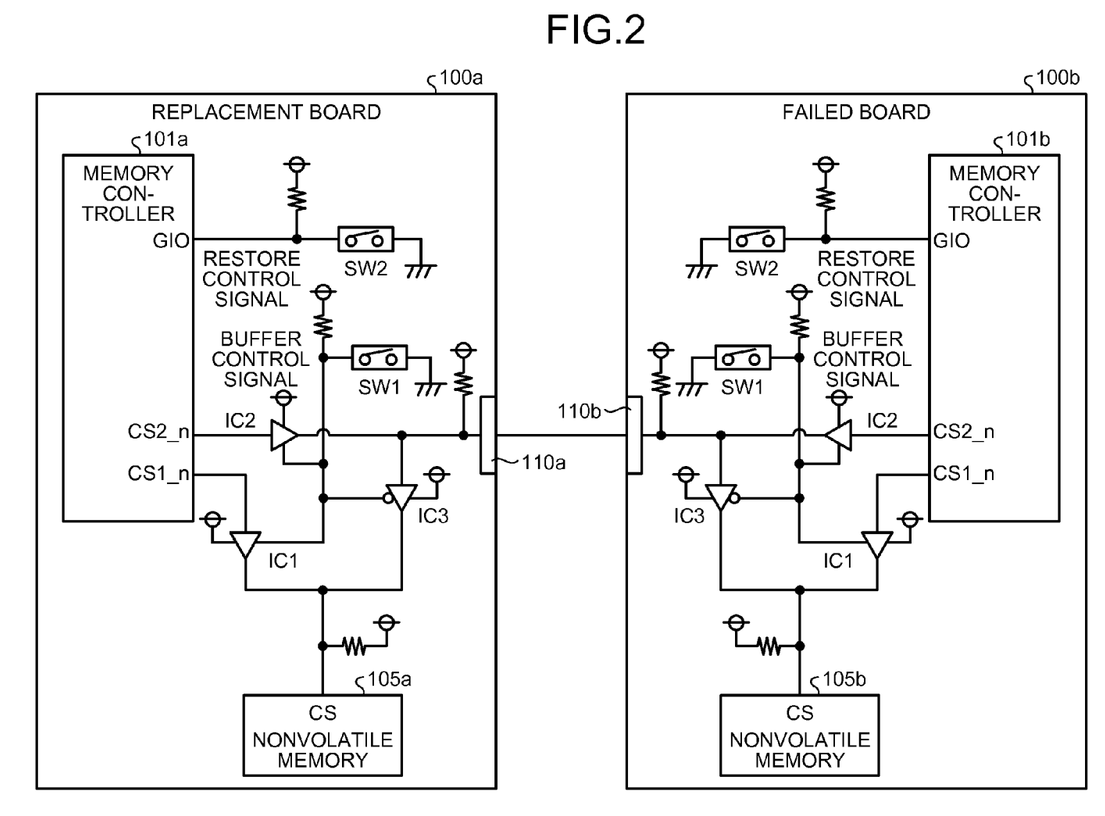
FIG. 2 is a circuit diagram of a failed board and a replacement board.

FIG. 1 is a schematic configuration diagram of a control system according to the first embodiment. FIG. 2 is a detailed circuit diagram of a failed board 100b and a replacement board 100a that make up the control system. The control system according to the first embodiment includes the failed board 100b, which is a failed board, and the replacement board 100a, which is a board with which the failed board 100b is to be replaced.

The disadvantages of the conventional technique are described in detail below. A facsimile control board can directly receive a lightning noise or the like from its environment. In that case, a device, a transistor, and/or the like near a telephone line in the facsimile control board is prone to damage. Meanwhile, a nonvolatile memory is contained on the facsimile control board. The nonvolatile memory stores therein data such as user-defined device information and a telephone directory.

Accordingly, when the facsimile control board is replaced, the nonvolatile memory that stores therein the user-defined data is replaced together with the facsimile control board, and, therefore, the need of adjusting device settings a second time arises. This leads to an increase in an amount of replacement operation.

Meanwhile, in a facsimile control board damaged by lightning noise, whereas devices near a telephone line are generally damaged, system devices including a memory controller and a nonvolatile memory are rarely damaged. Examples of a known conventional technique that takes this into account include a technique illustrated in FIGS. 11 and 12. This conventional technique is performed by preparing a maintenance board 1200 containing a nonvolatile memory 1205 of which capacity is equal to or larger than a capacity of a nonvolatile memory 1305 contained on a failed board 1300, which is a failed facsimile control board.

Figure 11:
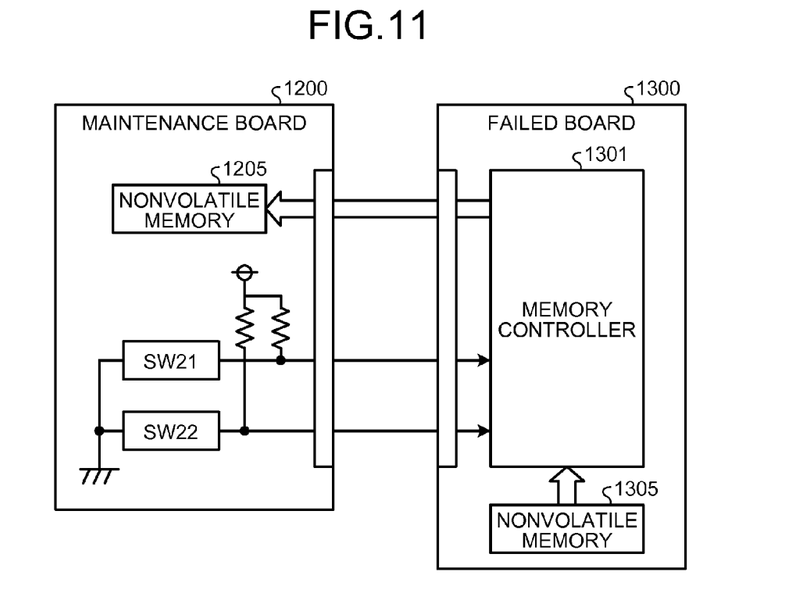
FIG. 11 is a configuration diagram of a conventional control system.

The maintenance board 1200 is connected to the failed facsimile control board (failed board) 1300. Electric power to the maintenance board 1200 is supplied from the failed board 1300, which is the failed facsimile control board. After the maintenance board 1200 is connected to the failed board 1300, a switch SW21 on the maintenance board 1200 is operated, and a notification is sent to a memory controller 1301 of the failed board 1300. Upon receiving the notification, the memory controller 1301 reads data from the nonvolatile memory 1305 contained on the failed board 1300 and writes the data to the nonvolatile memory 1205 contained on the maintenance board 1200. The data in the nonvolatile memory 1305 of the failed board 1300 is thus copied to the maintenance board 1200.

Figure 12:
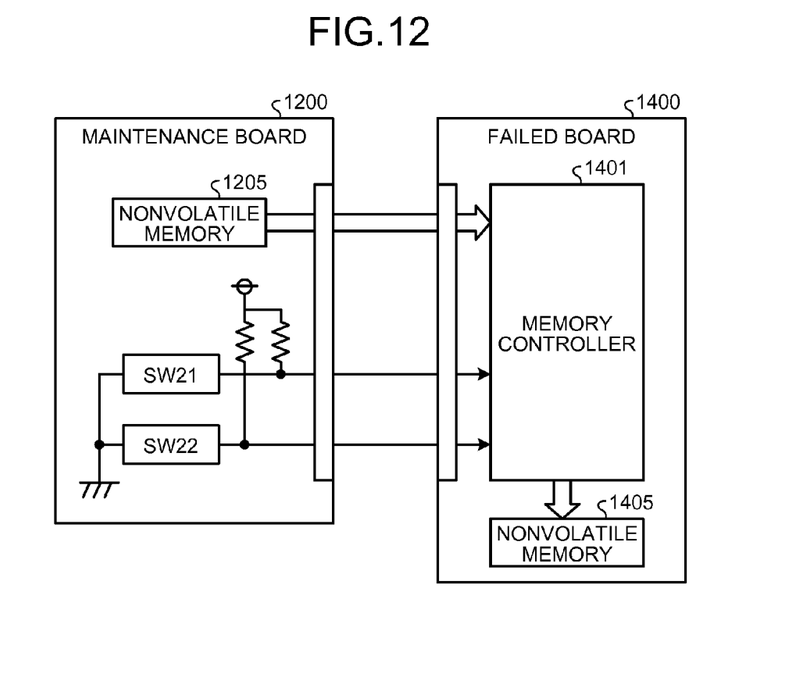
FIG. 12 is a configuration diagram of the conventional control system.

Subsequently, as illustrated in FIG. 12, the maintenance board 1200, to which the data in the nonvolatile memory 1305 of the failed board 1300 is copied, is connected to a replacement board 1400, which a facsimile control board with which the failed board 1300 is to be replaced. Electric power to the maintenance board 1200 is supplied from the replacement board 1400.

A switch SW22 on the maintenance board 1200 is operated, and a notification is sent to a memory controller 1401 of the replacement board 1400. Upon receiving the notification, the memory controller 1401 reads the data from the nonvolatile memory 1205 of the maintenance board 1200 and writes the data to a nonvolatile memory 1405 of the replacement board 1400. Thereafter, the maintenance board 1200 is disconnected from the replacement board 1400. The data including user-defined setting information and the like stored in the nonvolatile memory 1305 of the failed board 1300 is thus copied to the nonvolatile memory 1405 of the replacement board 1400. Accordingly, time and trouble of adjusting board settings a second time can be saved.

However, such a conventional technique requires fabricating the special maintenance board 1200 that is connectable to the facsimile control board. In addition, it is required to distribute the maintenance boards to service personnel around the world because failure of a facsimile control board can occur everywhere in the world. The conventional technique involves not only a considerably large amount of operations for maintenance management but also an increase in maintenance cost.

In contrast, in the first embodiment, in an event of a failure of a facsimile control board, the facsimile control board, which is the failed board 100b, is connected to the replacement board 100a, which is a facsimile control board that is identical in configuration with the failed board 100b. A backup copy of various types of data stored in a nonvolatile memory 105b of the failed board 100b is stored in the replacement board 100a, so that the failed board 100b is superseded by the replacement board 100a.

As illustrated in FIG. 1, a connector 110b, which is a connecting unit of the failed board 100b, is connected to a connector 110a, which is a connecting unit of the replacement board 100a, via a cable. As the cable, a cross cable is used in this example.

The failed facsimile control board, or the failed board 100b, includes a memory controller 101b, a buffer 102b, a switch SW1, and the nonvolatile memory 105b as illustrated in FIG. 1. The failed board also includes a switch SW2.

The replacement board 100a which is the facsimile control board, with which the failed board 100b is to be replaced, is also identical in configuration with the failed board. Specifically, the replacement board 100a includes a memory controller 101a, the switch SW1, the switch SW2, a buffer 102a, and a nonvolatile memory 105a.

The failed board 100b is described first below. The nonvolatile memory 105b stores therein various types of data such as setting information.

The switch SW1 is a switch for switching between a first state where the memory controller 101b can read data from the nonvolatile memory 105b and a second state where the memory controller 101b cannot read data from the nonvolatile memory 105b.

The buffer 102b is assumed as a three-state buffer operable to connect and disconnect bus connection between the memory controller 101b and the nonvolatile memory 105b according to a level of the switch SW1.

The switch SW2 is a switch for switching between a first state where data read from a nonvolatile memory of another facsimile control board (e.g., the replacement board 100a) connected to the failed board 100b is disabled and a second state where data read from the nonvolatile memory of the other facsimile control board connected to the failed board 100b is enabled.

The memory controller 101b controls data read/write from/to the nonvolatile memory 105b. In the first embodiment, when the failed board 100b is in the first state, the memory controller 101b writes or reads data to or from the nonvolatile memory 105b; when the failed board 100b is in the second state, the memory controller 101b reads data from a nonvolatile memory of another facsimile control board connected to the failed board 100b to copy the data to the nonvolatile memory 105b.

Connecting the replacement board 100a to the failed board 100b to read data from the failed board 100b places the failed board 100b and the replacement board 100a on a same local bus. Accordingly, the memory controllers 101a and 101b of the failed board 100b and the replacement board 100a start accessing the memories 105b and 105a at an instant when electric power is supplied to both the failed board 100b and the replacement board 100a, which results in data collision. In view of this disadvantage, in the first embodiment, each of the failed board 100b and the replacement board 100a includes the switch SW1 and the buffer 102b to avoid such data collision.

Specifically, when the switch SW1 of the failed board 100b is turned on, a buffer control signal goes low, by which the buffer 102b on the local bus is controlled to disconnect the memory controller 101b on the failed board 100b from the local bus; as a result, the failed board 100b is placed in the second state. Collision between data accessed by the memory controller 101a of the board 100a and data accessed by the memory controller 101b of the board 100b is avoided in this way.

The replacement board 100a is described below. The configuration of the replacement board 100a is similar to that of the failed board 100b described above. Relation between the replacement board 100a and the failed board 100b connected thereto is described.

The nonvolatile memory 105a stores therein various types of data such as setting information. The switch SW1 is a switch for switching between the first state where the memory controller 101a can read data from the nonvolatile memory 105a and the second state where the memory controller 101a cannot read data from the nonvolatile memory 105a.

The buffer 102a is assumed as a three-state buffer operable to connect and disconnect bus connection between the memory controller 101a and the nonvolatile memory 105a according to a level of the switch SW1.

The switch SW2 is a switch for switching between the first state where data read from the nonvolatile memory 105b of the failed board 100b, which is the other facsimile control board connected to the replacement board 100a, is disabled and the second state where data read from the nonvolatile memory 105b of the failed board 100b is enabled.

The memory controller 101a controls data read/write from/to the nonvolatile memory 105a. In the first embodiment, when the replacement board 100a is in the first state, the memory controller 101a writes or reads data to or from the nonvolatile memory 105a; when the replacement board 100a is in the second state, the memory controller 101a reads data from the nonvolatile memory 105b of the failed board 100b connected to the replacement board 100a to copy the data to the nonvolatile memory 105a.

When the switch SW2 of the replacement board 100a is turned on, the switch SW2 is direct-coupled to the ground (GND) and goes to a Low level. As a result, a restore control signal goes Low. Accordingly, the replacement board 100a is placed in the second state where the memory controller 101a can read data from the nonvolatile memory 105b of the failed board 100b, to which the replacement board 100a is connected.

On the other hand, when the switch SW2 is turned off, the switch SW2 is at high impedance; however, because of being connected a pull-up resistor, the switch SW2 is High. As a result, the restore control signal goes High. The replacement board 100a is thus placed in the first state where the memory controller 101a cannot read data from the nonvolatile memory 105b of the failed board 100b to which the replacement board 100a is connected.

A copying operation to be performed in the control system configured as described above is described below. When copying data stored in the nonvolatile memory 105b of the failed board 100b to the replacement board 100a, a user turns on the switch SW2 of the replacement board 100a first, and then turns on the switch SW1 of the failed board 100b. In this state, the memory controller 101a of the replacement board 100a starts reading data from the nonvolatile memory 105b of the failed board 100b and writing the read data to the nonvolatile memory 105a of the replacement board 100a.

Figure 3:
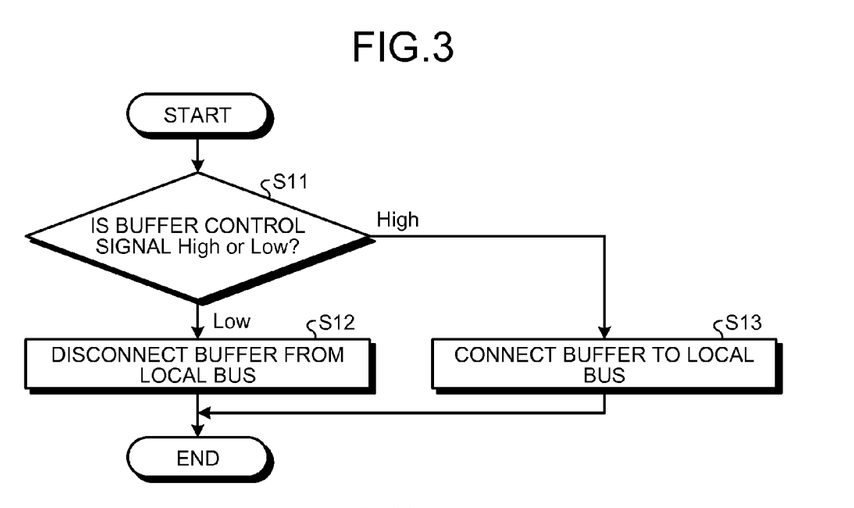
FIG. 3 is a flowchart of a process procedure for a switching operation in the failed board according to the first embodiment.

First, a switching operation to be performed when the switch SW1 of the failed board 100b is operated is described. FIG. 3 is a flowchart of a process procedure for the switching operation in the failed board 100b according to the first embodiment.

Turning on the switch SW1 brings the buffer control signal Low; turning off the switch SW1 brings the buffer control signal High. When the switch SW1 of the failed board 100b is turned off to bring the buffer control signal High (High at Step S11), the buffer 102b is connected to the local bus (Step S13), placing the failed board 100b in the first state where the memory controller 101b can read data from the nonvolatile memory 105b.

On the other hand, when the switch SW1 is turned on at Step S11 to bring the buffer control signal Low (Low at Step S11), the buffer 102b is disconnected from the local bus (Step S12), placing the failed board 100b in the second state where the memory controller 101b cannot read data from the nonvolatile memory 105b.

Figure 4:
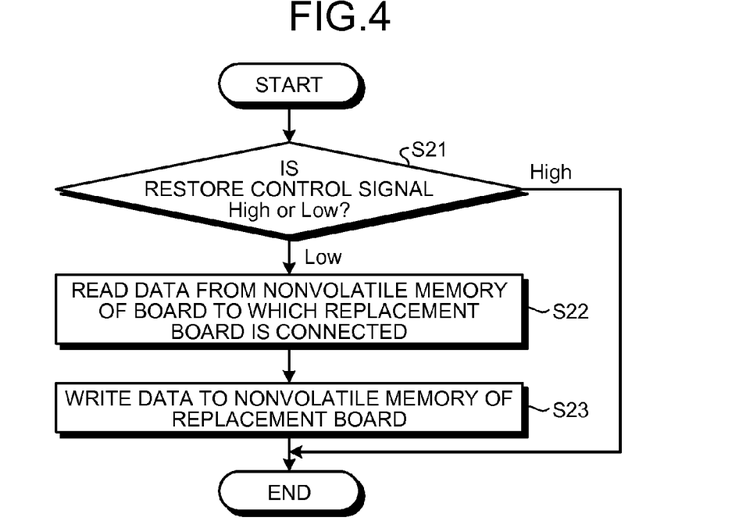
FIG. 4 is a flowchart of a process procedure for a copying operation in the replacement board according to the first embodiment.

A copying operation to be performed when the switch SW2 of the replacement board 100a is operated is described below. FIG. 4 is a flowchart of a process procedure for the copying operation in the replacement board 100a according to the first embodiment.

Turning on the switch SW2 brings the restore control signal Low; turning off the switch SW2 brings the restore control signal High. When the switch SW2 of the replacement board 100a is turned off to bring the restore control signal High (High at Step S21), the copying operation is terminated with no processing.

On the other hand, when the switch SW2 is turned on at Step S21 to bring the restore control signal Low (Low at Step S21), the replacement board 100a is placed in the second state. The memory controller 101a reads data stored in the nonvolatile memory 105b of the failed board 100b connected to the replacement board 100a (Step S22).

Subsequently, the memory controller 101a writes the data read from the nonvolatile memory 105b of the failed board 100b to the nonvolatile memory 105a of the replacement board 100a, on which the memory controller 101a is contained (Step S23). The data stored in the nonvolatile memory 105b of the failed board 100b is thus copied to the nonvolatile memory 105a of the replacement board 100a.

The copying operation described above with reference to FIGS. 3 and 4 is described below with reference to the circuit diagram illustrated in FIG. 2. Meanwhile, an output signal of each of IC1 and IC2 circuits is supplied as an input signal when the buffer control signal is High; the output is at high impedance when the buffer control signal is Low. By contrast, an output signal of an IC3 circuit is supplied as an input signal when the buffer control signal is Low; the output is at high impedance when the buffer control signal is High. The switches SW1 and SW2 of the replacement board 100a are turned off and on, respectively; the switches SW1 and SW2 of the failed board 100b are turned on and off, respectively.

A signal from a CS2_n pin (hereinafter, "CS2_n signal") of the replacement board 100a travels via the IC2 circuit to the failed board 100b. Because the failed board 100b and the replacement board 100a are connected in one-to-one relationship, this CS2_n signal is likely to collide with a CS2_n signal from a CS2_n pin of the failed board 100b. However, because the IC2 circuit is provided and the buffer control signal is Low, the CS2_n pin of the failed board 100b is disabled by the IC2 circuit.

Accordingly, collision between the CS2_n signal from the replacement board 100a and the CS2_n signal from the failed board 100b is avoided, allowing the CS2_n signal from the replacement board 100a to travel to the IC3 circuit of the failed board 100b. In contrast to the IC2 circuit, the IC3 circuit is open at its gate. Accordingly, the CS2_n signal from the replacement board 100a travels through the IC3 circuit to a CS pin of the nonvolatile memory 105b. At this time, the CS2_n signal from the replacement board 100a is likely to collide with a signal from a CS1_n pin of the failed board 100b. However, the IC1 circuit that provides the same function as the IC2 circuit prevents this collision.

Meanwhile, the CS2_n pin of the replacement board 100a is also connected to the CS pin of the nonvolatile memory 105a of the replacement board 100a. However, the IC3 circuit is interposed therebetween, and the switch SW1 of the replacement board 100a is off or, in other words, the buffer control signal is at the High level; accordingly, a signal from the CS2_n pin of the replacement board 100a is not input to the CS pin of the nonvolatile memory 105a. Therefore, concurrent read from the nonvolatile memories 105a and 105b of the replacement board 100a and the failed board 100b does not occur.

Thereafter, the read data is input to the CS pin of the nonvolatile memory 105a of the replacement board 100a using the CS1_n pin of the replacement board 100a to be written to the nonvolatile memory 105a.

As described above, in the first embodiment, the failed board 100b, which is the failed facsimile control board, is connected to the replacement board 100a, which is the facsimile control board only for use in replacement and identical in configuration with the failed board 100b; and data stored in the nonvolatile memory 105b of the failed board 100b is copied to the nonvolatile memory 105a of the replacement board 100a. Accordingly, not only maintenance management can be facilitated but also maintenance cost can be reduced.

In addition, in the first embodiment, when the replacement board 100a reads data from the nonvolatile memory 105b of the failed board 100b, the switch SW1 of the failed board 100b is operated to control the buffer on the local bus, thereby disconnecting the memory controller 101b on the failed board 100b from the local bus. Accordingly, collision between data accessed by the memory controller 101b of the failed board 100b and data accessed by the memory controller 101a of the replacement board 100a can be avoided.

First Modification

Figure 5:
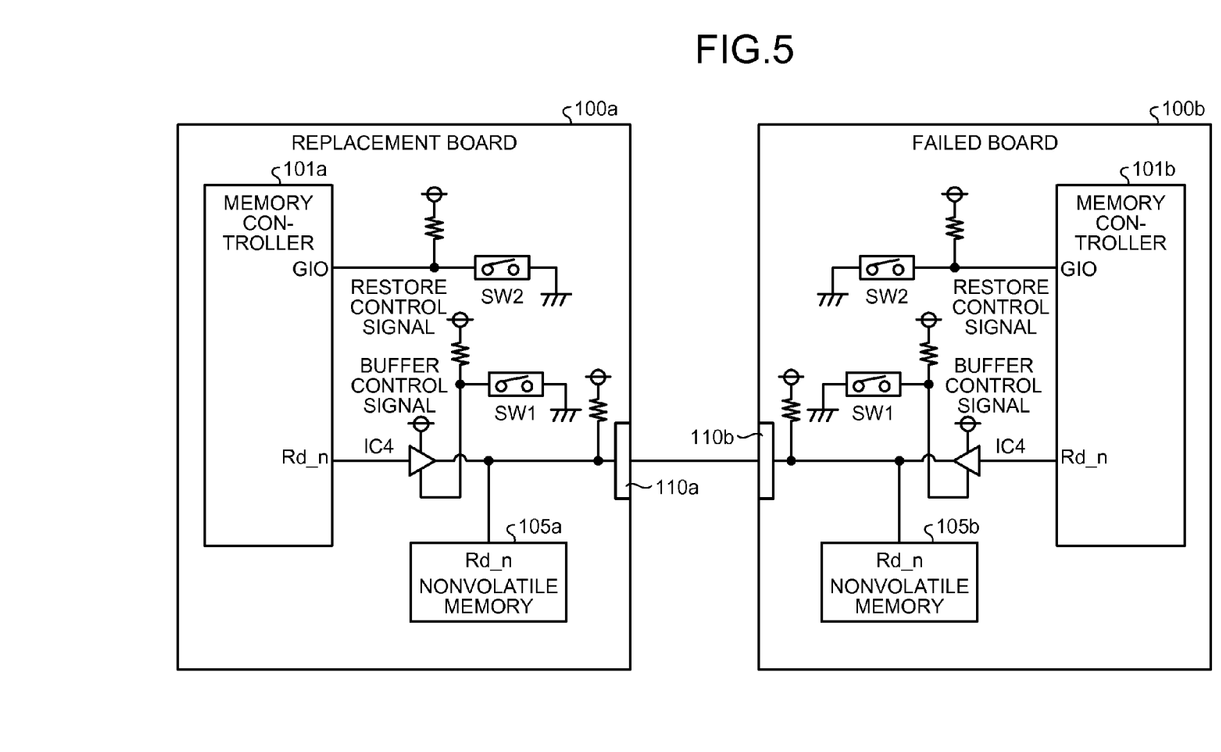
FIG. 5 is a circuit diagram of a first modification of the first embodiment to the failed board and the replacement board.

In the first embodiment, the CS pins are described with reference to FIG. 2. However, a read signal, a write signal, a data bus, and an address bus are described in a first modification. FIG. 5 is a circuit diagram of a failed board and a replacement board that make up a control system of the first modification to the first embodiment. Inputting a read signal or a write signal to the data bus, the address bus, or a nonvolatile memory that is not accessed poses no problem. Accordingly, the first modification can be configured as a simple circuit that includes only an IC4 circuit as illustrated in FIG. 5.

Second Modification

In the first embodiment, the switch SW2 is used to switch the restore control signal between Low and High. In a second modification, the restore control signal is switched between Low and High without using the switch SW2.

Figure 6:
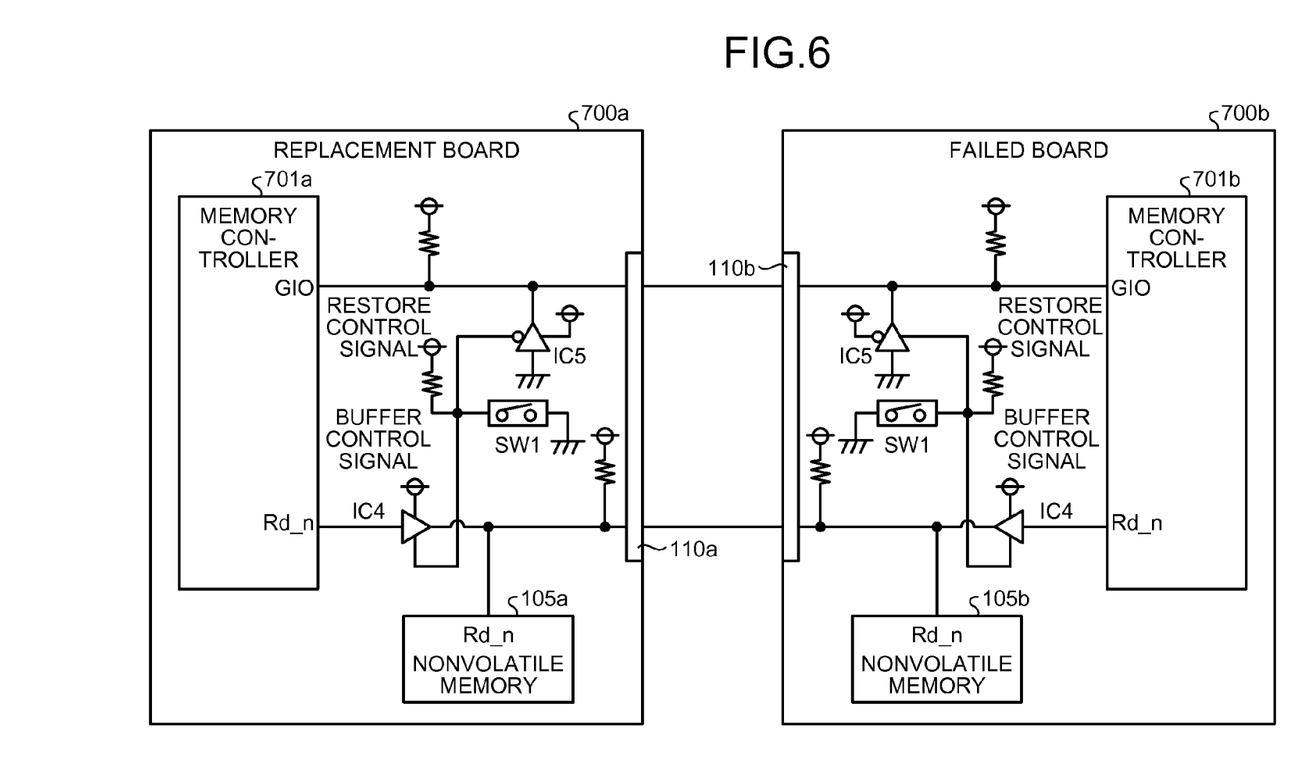
FIG. 6 is a circuit diagram of a second modification of the first embodiment to the failed board and the replacement board.

FIG. 6 is a circuit diagram of a failed board and a replacement board that make up a control system of the second modification to the first embodiment. When copying data stored in the nonvolatile memory 105b of a failed board 700b to a replacement board 700a, a user turns on the switch SW1 of the failed board 700b.

When the switch SW1 is on, a gate of an IC5 circuit of the failed board 700b opens, and a restore control signal is brought Low, and, therefore, Low is input to a GIO pin of a memory controller 701a on the replacement board 700a. Thus, the need of the switch SW2 can be omitted by performing a simple operation of operating the switch SW1 of the failed board 700b. Furthermore, the failed board 700b is discarded in its as-is status. Accordingly, even in a case where the switch SW1 be left without being turned off, no problem occurs.

Second Embodiment

Figure 13:
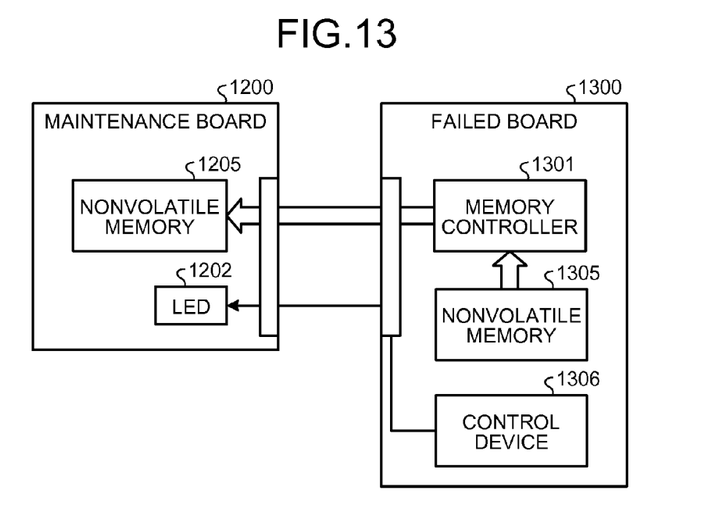
FIG. 13 is a configuration diagram of another conventional control system.
Figure 14:
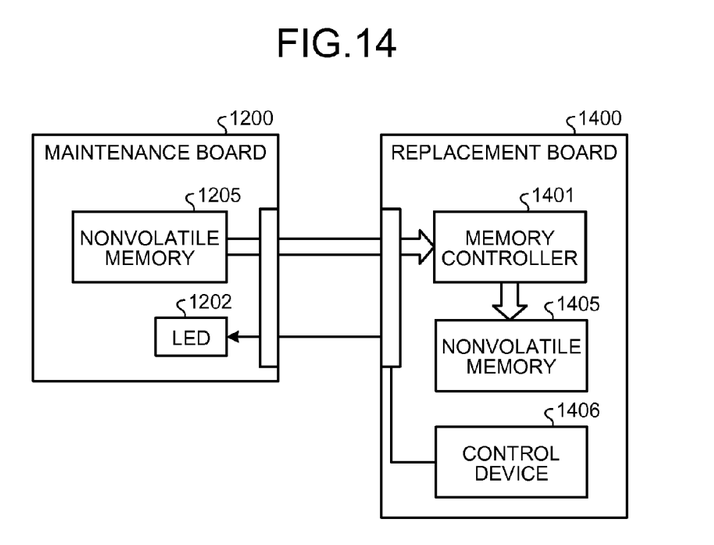
FIG. 14 is a configuration diagram of the other conventional control system.

A second embodiment differs from the first embodiment in providing a board with an announcing function and, when copying data stored in a nonvolatile memory of a failed board, determining whether the nonvolatile memory is faulty or not. FIGS. 13 and 14 are configuration diagrams of a conventional control system. In the conventional technique, the maintenance board 1200 contains a light-emitting diode (LED) 1202, which is controlled by a control device 1406 of the replacement board 1400. Completion of data copying is indicated by changing a flashing/lighting mode of the LED 1202. However, such a conventional technique requires an additional data bus for controlling the LED 1202, which results in an increase in the number of cables.

An approach of controlling an LED mounted on the replacement board 1400 is conceivable. However, because it is assumed that the replacement board 1400 performs data copying in a state of being housed in equipment or the like, flashing/lighting of the LED may not be visible to a user.

Under the circumstance, in the second embodiment, a replacement board is configured to include a control device connected to a speaker or a buzzer of an apparatus, on which the replacement board is contained, and having an announcing function.

Figure 7:
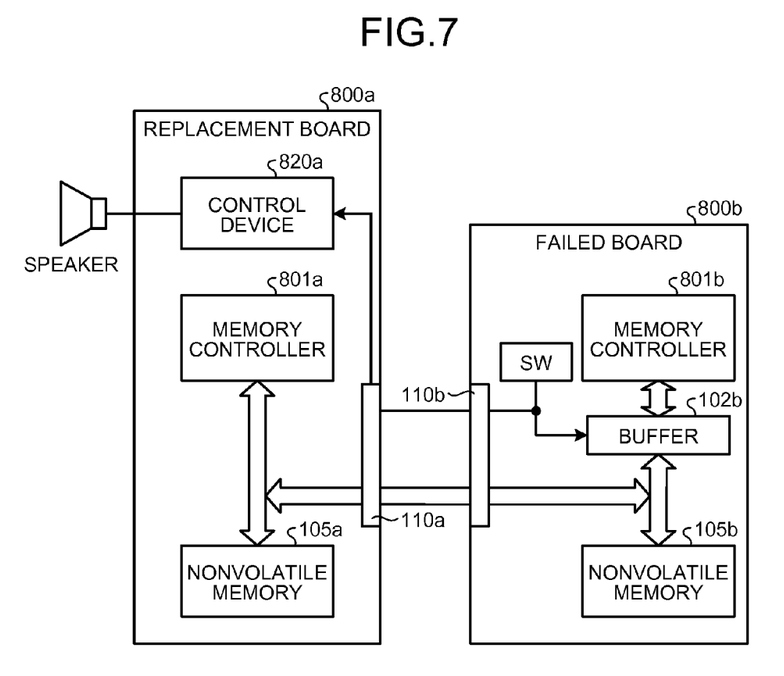
FIG. 7 is a configuration diagram of a control system according to a second embodiment.

FIG. 7 is a configuration diagram of a control system according to the second embodiment. As illustrated in FIG. 7, in the second embodiment, a failed board 800b, which is a failed facsimile control board, is connected to a replacement board 800a, which a facsimile control board with which the failed board 800b is to be replaced.

The failed board 800b and the replacement board 800a are identical in configuration to each other. Each of the boards 800a and 800b includes a memory controller 801a or 801b, the buffer 102b, the switch SW, the nonvolatile memory 105a or 105b, and a control device 820a.

In FIG. 7, the control device is omitted from the failed board 800b; the buffer and the switch are omitted form the replacement board 800a. The buffer 102b, the switch SW, and the nonvolatile memory 105b provide functions similar to those of the first embodiment.

The control device 820a functions as an announcing unit. At completion of the copying operation or the like, the control device 820a sends an announcement about the completion or the like to an output device external to the replacement board 800a. Examples of the output device include a speaker of equipment, on which the replacement board 800a is contained.

In the first embodiment, it is assumed that lightning noise or the like causes a failure in a device(s) near a telephone line of a facsimile control board. However, there can also be a case where a failure occurs to a nonvolatile memory. Such a failure in a nonvolatile memory leads not only to disabling data read from the nonvolatile memory of the failed board, but also to a problem that, in a situation where data (hereinafter, "damaged data") that is damaged or the like by the failure is stored in the nonvolatile memory, copying the damaged data to a nonvolatile memory of a replacement board results in that equipment undesirably operates based on faulty data.

However, in the second embodiment, preset verification data is stored at specific addresses in the nonvolatile memories 105a and 105b in advance. Copying data is permitted only when the verification data is verified, so that equipment is prevented from operating based on faulty data. Hereinafter, this verification data is referred to as "the marker".

The marker can be stored at desired timing; however, it is preferable to store the marker in the nonvolatile memory 105a, 105b at initial power supply to the facsimile control board.

The memory controller 801a functions as a verifying unit that operates as follows. When the replacement board 800a is in the second state for copying data stored in the nonvolatile memory 105b of the failed board 800b, the memory controller 801a reads the marker from the nonvolatile memory 105b of the failed board 800b, which is the facsimile control board to which the replacement board 800a is connected, and conducts verification of the read marker. The verification of the marker is performed by determining whether the marker matches the marker stored in the nonvolatile memory 105a of the replacement board 800a or not. However, an employable method for the verification is not limited thereto. The control device 820a also outputs an announcement about a result of the verification of the marker by the speaker or the like.

When the marker read from the nonvolatile memory 105b of the failed board 800b is verified, the memory controller 801a reads data stored in the nonvolatile memory 105b of the failed board 800b to copy the data to the nonvolatile memory 105a as in the first embodiment. The memory controller 801b on the failed board 800b has a similar function to the function of the memory controller 801a of the replacement board 800a.

Figure 8:
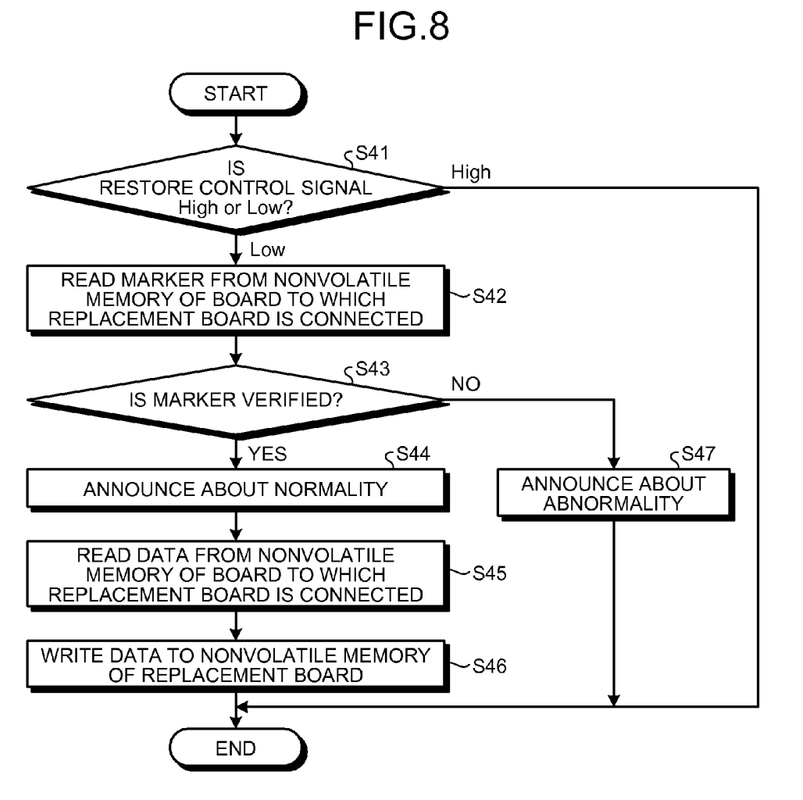
FIG. 8 is a flowchart of a process procedure for a copying operation in a replacement board according to the second embodiment.

A copying operation in the second embodiment configured as described above is described below. FIG. 8 is a flowchart of a process procedure for the copying operation in the replacement board 800a according to the second embodiment.

Turning on the switch SW brings a restore control signal Low; turning off the switch SW brings the restore control signal High. When the switch SW of the replacement board 800a is turned off, the restore control signal goes High (High at Step S41), and the copying operation is terminated with no processing.

On the other hand, when the switch SW is turned on at Step S41, the restore control signal goes Low (Low at Step S41), and the replacement board 800a is placed in the second state. The memory controller 801a reads the marker from the nonvolatile memory 105b of the failed board 800b connected to the replacement board 800a (Step S42).

The memory controller 801a verifies the marker to determine whether the marker is correct or not (Step S43). When the marker is not verified (No at Step S43), the control device 820a announces about abnormality through the speaker or the like (Step S47).

On the other hand, when the marker is verified (Yes at Step S43), the control device 820a announces about normality through the speaker or the like (Step S44). The memory controller 801a reads data stored in the nonvolatile memory 105b of the failed board 800b, to which the replacement board 800a is connected (Step S45).

Subsequently, the memory controller 801a writes the data read from the nonvolatile memory 105b of the failed board 800b to the nonvolatile memory 105a of the replacement board 800a, on which the memory controller 801a is contained (Step S46). The data stored in the nonvolatile memory 105b of the failed board 800b is thus copied to the nonvolatile memory 105a of the replacement board 800a.

As described above, in the second embodiment, the preset marker is stored at the specific addresses in the nonvolatile memories 105a and 105b in advance, and copying data from the nonvolatile memory 105b of the failed board 800b to the replacement board 800a is performed only when the marker is verified. Accordingly, copying is not performed in a case where the nonvolatile memory 105b of the failed board 800b is faulty; and therefore equipment is prevented from operating based on a copy of faulty data.

Furthermore, in the second embodiment, the replacement includes the control device connected to a speaker or a buzzer of an apparatus, on which the replacement board is contained, and having the announcing function. Accordingly, it is possible to make various announcements while maintaining an addition of a cable for control signals and favorably high visibility.

First Modification

In a first modification to the second embodiment, the control device 820a outputs an announcement by a speaker, a buzzer, or the like at a sound level preset to equipment, on which the facsimile control board is contained.

Figure 9:
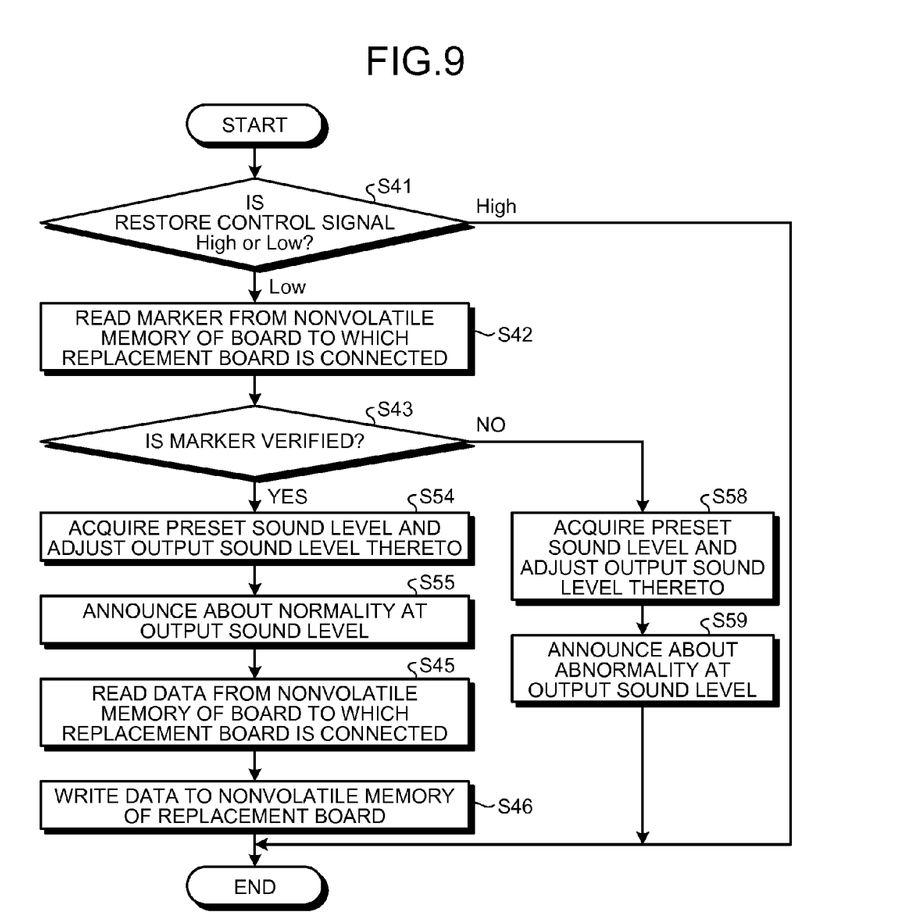
FIG. 9 is a flowchart of a process procedure for a copying operation to be performed in a first modification to the replacement board according to the second embodiment.

FIG. 9 is a flowchart of a process procedure for a copying operation to be performed in the first modification to the replacement board 800a according to the second embodiment. Processing from Steps S41 to S43 is performed as in the second embodiment.

In the first modification to the second embodiment, when the marker is verified at Step S43 (Yes at Step S43), the control device 820a acquires a preset sound level that is set to equipment, on which the replacement board 800a is contained, and adjusts an output sound level to the preset sound level (Step S54). The control device 820a announces about normality through a speaker or the like of the equipment at this output sound level (Step S55). Subsequent processing (Steps S45 and S46) is similar to that of the second embodiment.

Also when the marker is not verified at Step S43 (No at Step S43), the control device 820a acquires the preset sound level that is set to the equipment, on which the replacement board 800a is contained, and adjusts the output sound level to the preset sound level (Step S58). The control device 820a announces about abnormality through the speaker or the like of the equipment at this output sound level (Step S59).

As described above, in the first modification to the second embodiment, the control device 820a outputs an announcement by the speaker, the buzzer, or the like at the sound level preset to the equipment, on which the facsimile control board is contained. Accordingly, a user can hear sound clearly irrespective of a location where the speaker, the buzzer, or the like is arranged.

Second Modification

In a second modification to the second embodiment, the control device 820a makes announcement at a sound level preset to equipment, on which the facsimile control board is contained; however, when setting of the equipment is mute, the control device 820a makes announcement at a factory-default sound level (hereinafter, "default sound level") of the equipment.

Figure 10:
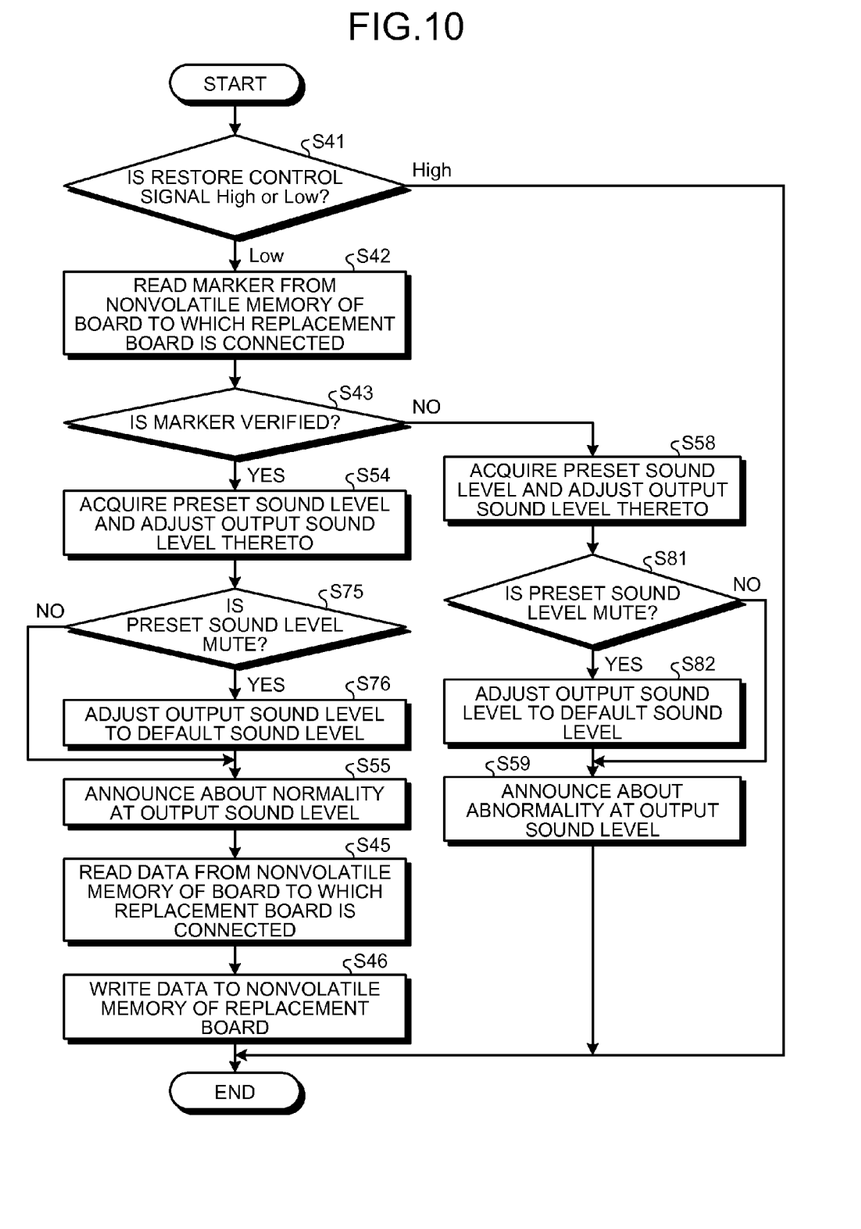
FIG. 10 is a flowchart of a process procedure for a copying operation to be performed in a second modification to the replacement board according to the second embodiment.

FIG. 10 is a flowchart of a process procedure for a copying operation to be performed in the second modification to the replacement board 800a according to the second embodiment. Processing from Steps S41 to S43 is performed as in the second embodiment.

In the second modification to the second embodiment, when the marker is verified at Step S43 (Yes at Step S43), the control device 820a acquires a preset sound level that is set to equipment, on which the replacement board 800a is contained, and adjusts an output sound level to the preset sound level (Step S54). The control device 820a determines whether the acquired preset sound level is mute or not (Step S75).

When the acquired preset sound level is mute (Yes at Step S75), the control device 820a acquires a default sound level of the equipment and adjusts the output sound level to this default sound level (Step S76).

On the other hand, when the preset sound level acquired at Step S75 is not mute (No at Step S75), the control device 820a skips Step S76.

The control device 820a announces about normality through a speaker or the like of the equipment at the output sound level (Step S55). Subsequent processing (Steps S45 and S46) is similar to that of the second embodiment.

Also when the marker is not verified at Step S43 (No at Step S43), the control device 820a acquires the preset sound level that is set to the equipment, on which the replacement board 800a is contained, and adjusts the output sound level to the preset sound level (Step S58). The control device 820a determines whether the acquired preset sound level is mute or not (Step S81). When the acquired preset sound level is mute (Yes at Step S81), the control device 820a acquires the default sound level of the equipment and adjusts the output sound level to this default sound level (Step S82). When the preset sound level acquired at Step S81 is not mute (No at Step S81), the control device 820a skips Step S82. The control device 820a announces about abnormality through the speaker or the like of the equipment at the output sound level (Step S55).

According to the embodiments, because the need of fabricating a maintenance board is eliminated, effects of facilitating maintenance management and reducing maintenance cost are obtained.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A control circuit board comprising:
    a first storage unit configured to store therein predetermined data;
    a connecting unit configured to be connected to another control circuit board that includes a second storage unit;
    a switching unit configured to switch between a first state and a second state, the first state being a state in which data read from the first storage unit is enabled but data read from the second storage unit is disabled, the second state being a state in which data read from the first storage unit is disabled but data read from the second storage unit is enabled; and
    a storage control unit configured to
        write or read data to or from the first storage unit in the first state, and
        perform a copying operation that reads the data from the second storage unit and stores the read data in the first storage unit in the second state.

2. The control circuit board according to claim 1, wherein the switching unit includes
    a first switching unit configured to switch between a state where data read from the first storage unit is enabled and a state where data read from the first storage unit is disabled, and
    a second switching unit configured to switch between a state where data read from the second storage unit is disabled and a state where data read from the second storage unit is enabled.

3. The control circuit board according to claim 1, further comprising
    a verifying unit configured to read predetermined verification data stored in the second storage unit and verify the read verification data when switching to the second state is made, wherein
    the storage control unit performs the copying operation when the read verification data is verified.

4. The control circuit board according to claim 3, further comprising an announcing unit configured to send an announcement about a result of verification of the verification data performed by the verifying unit to an external output device.

5. The heater controller according to claim 4, wherein the announcing unit outputs the verification result as sound output at a preset sound level.

6. The heater controller according to claim 5, wherein the announcing unit outputs the verification result as sound output at a default sound level when setting for the sound level is mute.

7. A control system comprising:
    a first control circuit board; and
    a second control circuit board including a second storage unit, wherein
    the first control circuit board includes
        a first storage unit configured to store therein predetermined data;
        a connecting unit configured to be connected to the second control circuit board;
    a switching unit configured to switch between a first state and a second state, the first state being a state in which data read from the first storage unit is enabled but data read from the second storage unit is disabled, the second state being a state in which data read from the first storage unit is disabled but data read from the second storage unit is enabled; and a storage control unit configured to
- write or read data to or from the first storage unit in the first state, and
- perform a copying operation that reads the data from the second storage unit and stores the read data in the first storage unit in the second state.

8. A copying method performed in a control circuit board that includes a first storage unit configured to store therein predetermined data and a connecting unit configured to be connected to another control circuit board that includes a second storage unit, the copying method comprising:
- switching between a first state and a second state, the first state being a state in which data read from the first storage unit is enabled but data read from the second storage unit is disabled, the second state being a state in which data read from the first storage unit is disabled but data read from the second storage unit is enabled;
- writing or reading data to or from the first storage unit in the first state; and
- performing a copying operation that reads the data from the second storage unit and stores the read data in the first storage unit in the second state.

* * * * *